United States Patent [19]

King et al.

[11] 4,166,972

[45] Sep. 4, 1979

[54] NMR DISCRIMINATION APPARATUS AND METHOD THEREFOR

[75] Inventors: James D. King; George A. Matzkanin; William L. Rollwitz, all of San Antionio, Tex.

[73] Assignee: Southwest Research Institute, San Antonio, Tex.

[21] Appl. No.: 839,519

[22] Filed: Oct. 5, 1977

[51] Int. Cl.² ............................................. G01R 33/08
[52] U.S. Cl. ............................ 324/0.5 AC; 324/0.5 A
[58] Field of Search .......... 324/0.5 R, 0.5 A, 0.5 AC, 324/0.5 AH

[56] References Cited

U.S. PATENT DOCUMENTS

| 3,530,371 | 9/1970 | Nelson et al. | 324/0.5 AC |
| 3,681,680 | 8/1972 | Ernst | 324/0.5 AC |

OTHER PUBLICATIONS

E. R. Davies, "A New Pulse Endor Technique," Physics Letters, vol. 47A, No. 1, Feb. 15, 1974, pp. 1 and 2.

*Primary Examiner*—M. Tokar
*Attorney, Agent, or Firm*—Donald Gunn

[57] ABSTRACT

A method and apparatus for enhanced nuclear magnetic resonance (NMR) discrimination and detection is disclosed. In the preferred embodiment, a sample which has a first atomic element is placed in a magnetic field of a first intensity. A reaction between the nuclei of the first atomic element and the electromagnetic field of the apparatus produces an NMR response which is tunable with field intensity. If the first atomic element of interest is present and intimately comingled with a second atomic element of interest, as might occur in compounds, and if the second element of interest has a nuclear quadrupolar moment and if the molecular structure conditions are proper for it to have a nuclear quadrupolar resonance (NQR), then adjustment of the magnetic field intensity varies the NMR frequency of the first element of interest to coincide with the NQR frequency of the second element of interest. Energy is then transferred in an enhanced fashion between the nuclei of the first element of interest and the nuclei of the second element of interest. This increased ease of transfer of energy between the two nuclei under the foregoing conditions reduces the NMR response time of the first element thereby improving the detectability of that element. Implementation of this effect is the basis for the reduced detection time and the improved discrimination achieved in the apparatus of this invention.

A second aspect of the discrimination capabilities of the apparatus is achieved by varying the elapsed time between successive observations of the NMR response of the first element of interest. An apparatus and method allow the detection and measurement of a first element of interest in a particular compound while rejecting the NMR response from the same element located in different compounds.

52 Claims, 6 Drawing Figures

SIGNAL VS. TIME

MAGNETIC FIELD INTENSITY FOR MANY LEVEL CROSSINGS

CROSS-OVER OF $N^{14}$ QUADRUPOLE RESONANCES WITH THE $H^1$ MAGNETIC RESONANCE IN RDX.

NMR DISCRIMINATION APPARATUS AND METHOD THEREFOR

BACKGROUND OF THE DISCLOSURE

The present disclosure is directed to detection apparatus for elements. It contemplates the use of NMR techniques. It particularly finds application in an apparatus used in the detection and quantitative measurement of hidden or secreted explosives. The present invention can be readily adapted for detection of other materials in a wide range of circumstances. Explosives are presenting more and more problems to airlines, postal authorities, packing and shipping clerks, and many other people. Explosives in letter bombs and other hidden explosives have created severe problems, causing serious injuries and sometimes death, as radical groups, including political extremists, resort to the use of explosives and secreted bombs to settle their grievances. Detection of explosives hidden in packages, letters and elsewhere has become a problem. They are easy to detect with metal detectors if they incorporate substantial quantities of metal. Known techniques will locate such explosives by detecting the presence of metal. However, it is possible to make nonmetallic explosive bombs. The so-called letter bomb is a good example of this. It is relatively lightweight, not susceptible to conventional metal detection techniques, and is otherwise quite dangerous. It is dangerous because it typically does not explode until someone attempts to open it, resulting in serious injuries to the hands and upper portions of the body. It is so small that it can hardly be detected in and among a typical batch delivery of mail.

The detection technique must obtain a unique indication of the explosive. The unique nature of the response is thus tied to the fact that the primary and basic constituent of any type of secreted bomb or explosive device is, in fact, explosive material itself. As a consequence of the present invention, enhanced nuclear magnetic resonance detection apparatus has been provided which is able to detect explosives without requiring direct physical contact between the suspected material and the detection apparatus. The present invention thus utilizes easily achieved electromagnetic fields which penetrate into the package or suspected parcel. Indeed, the magnetic field will penetrate the earth and other nonmetallic low conductivity materials. Such materials include wood, plastics, glass and the like. For instance, a letter bomb can be easily detected using the present invention. This invention can also detect explosives in baggage or parcels. A land mine which is buried in the ground and which is formed solely of explosives and plastic parts can also be detected. Metal detectors, including beat frequency oscillators, are unable to detect bombs made without metal.

Nuclear magnetic resonance is defined as the resonance achieved whereby energy is transferred between an RF magnetic field and a nucleus placed in a constant magnetic field sufficiently strong to at least partly decouple the nucleus from its orbital electrons. The relationship between frequency at which maximum energy is absorbed by the atomic nuclei of the element, the resonant frequency and the magnetic field intensity is a clue to identification of the particular element involved. The NMR detection technique, in general, is old and is found in various detector systems. The difficulty with it lies in part in the scale factors. For instance, significant quantities of material must be present to concentrate the element of interest so that a sizable response is obtained. The signals obtained by NMR are ordinarily very small which requires high quality detection equipment. To the extent that they are larger for some elements, they typically are smaller for other elements. This is particularly true for some elements where the isotope of the element of interest is available only in minute quantities. Moreover, close coupling has been required to improve the NMR signal.

Explosive detection typically is based on detecting several elements together. Fortunately, the elements to be detected come in different ratios for different explosives which therefore have different signatures. Typically, explosive compounds include hydrogen, nitrogen, carbon and oxygen. The relative amounts of each element varies, and, in some explosives, one of these elements may not be present. The response of hydrogen to NMR techniques is maximum compared to nitrogen. Regretably, hydrogen is typically always a constituent of the materials near or surrounding the specimen of interest. Thus, one may have to look to the responses of several combinations of the elements in the suspected explosive.

The present invention, in the preferred embodiment, uses the transient response to yield enhanced detection and to overcome the problems of a steady state detection apparatus. The problems include a lack of sensitivity in the detector, the difficulties of obtaining adequate magnetic field strength and homogeneity at the suspected specimen, and the difficulty of separating signals from hydrogen nuclei resident in supporting materials such as wood, plastic, soil, etc. The use of transient apparatus reduces the necessity for high quality homogeneous magnetic fields. This lowers the size, cost and complexity of the apparatus. Moreover, since the coupling between nuclei or nuclei and the lattice relates to the relaxation time, the transient NMR signal may be more easily analyzed to delineate hydrogen nuclei in a solid (perhaps the explosive) from hydrogen nuclei in plastic or fluid materials, typically water or pulpy materials such as wood, paper or cloth.

One scale factor which presents great difficulties in NMR techniques utilizing transient or steady state response is the extremely large values of the so-called longitudinal or spin-lattice relaxation time often observed in many compounds. These times can measure tens of minutes, sometimes hours, in solids. Detection of the NMR response from such materials requires that they remain in a polarizing magnetic field, undisturbed for a time comparable to the spin-lattice relaxation time prior to testing and observation. The relaxation time is so unduly large in such materials that NMR detection and measurement cannot be used other than for laboratory investigations. Practical applications are forbidden as a result of this scale factor.

The longitudinal relaxation time (hereinafter referred to as $T_1$) for selected compounds may be reduced in certain conditions by the present invention. It has been discovered that it is possible to adjust the polarizing magnetic field applied to the specimen of interest so that two atomic elements in the specimen are interacted. As an easy example, consider an explosive material which has nitrogen and hydrogen. It is possible to adjust the polarizing magnetic field so that the separation between Zeeman energy levels for the proton (hydrogen nuclei) coincides with that between the quadrupolar energy levels for the nitrogen spin system. In certain compounds, the hydrogen and nitrogen are situated relative to the lattice such that the hydrogen $T_1$ is reduced as a result of the transfer of energy between the nitrogen nuclei and the hydrogen nuclei. This transfer is enhanced when the NMR frequency of the hydrogen coincides with the NQR frequency of nitrogen.

The present invention is further capable of discriminating the NMR response of the same type nuclei in a different material. As a simple example, the NMR response of hydrogen nuclei in a solid is typically different from that of hydrogen nuclei in a liquid. As another example, the NMR response of hydrogen in some explosives may be discriminated from that of many nonexplosive materials. This is helpful in discriminating between different types of materials as in the detection of secreted explosives.

The NMR response has a second time constant descriptive of it which is the transverse time response or spin-spin relaxation time constant, or $T_2$ hereinafter. It has been found highly desirable to seek the longitudinal time response, or $T_1$, of most elements in contrast to detection of $T_2$. The present invention is uniquely successful in that it is able to modify and reduce $T_1$ in selected materials to a smaller value and thereby obtain a more rapid response. This serves to distinguish the NMR response of various materials from other materials. This enables prompt and rapid recognition of the unique signature of various explosive materials.

In an alternate form not using the NMR-NQR between two different types of nuclei, the magnetic field is held steady, and the time between successive NMR responses elicited from the sample is varied. Compounds having different relaxation times $T_1$ can be discriminated by this form of the invention. For a given element in a particular compound, the response will vary dependent on the elapsed time between successive observations of the response time.

BRIEF DESCRIPTION OF THE PREFERRED EMBODIMENT

The apparatus and method of the present invention are directed to an enhanced NMR detection technique. In one embodiment, first and second elements in the presence of one another are tested in a specimen which is potentially an explosive. Through the testing of the specimen having two elements in it, a magnetic field is imposed on the test specimen. If the first element has a nuclear magnetic dipole moment, then it will have a nuclear magnetic resonance at a frequency which is proportional to an externally applied magnetic field. If that magnetic field is made to be of such an intensity that the NMR frequency of the first element coincides with the NQR frequency of the second element, coupling between the species nuclei will be greatly enhanced, and $T_1$ will be measurably reduced. Under these conditions, energy passes more freely and rapidly between the two elements. This typically will reduce $T_1$ of one of the elements and sometimes of both.

This invention makes use of this characteristic to reduce the time required for detection of an NMR response and to provide a means for separating the NMR response produced by nuclei by certain selected materials from the NMR response produced by the same type nuclei in different, and usually more common, materials. It shold be remembered that the amplitude of the NMR response is dependent upon the quantity or concentration of nuclei, the type nuclei and other scale factors.

The response is also a function of the amount of time (relative to $T_1$) that the sample has been allowed to remain in an appropriate magnetic field prior to being tested. Some time is required to allow the nuclei to become aligned with the magnetic field such as is necessary to produce the largest NMR effects. Increased time normally aligns more of the nuclei with the polarizing field. The alternating electromagnetic field produced by the transmitter in the process of obtaining the NMR response from the sample causes the nuclear alignment to be disturbed. The disturbance can be substantial. Realignment as necessary to obtain an appreciable NMR response in subsequent tests is limited by the time constant of the nuclei. If attempts are made to repeatedly test the NMR response of the sample separated by a time interval between tests that is short compared to $T_1$, the NMR output signal is greatly reduced. The apparatus of this invention varies the time constant of the nuclei in a controlled manner to reduce the time required for obtaining an NMR response of a useful amplitude and yielding enhanced response from nuclei in a selected material. When the sample is laced in a magnetic field of such an intensity that the NMR frequency of the type nuclei to be detected coincides with the NQR frequency of a second type nuclei in the same compound, the $T_1$ of the first nuclei may be reduced by an appreciable factor. In this invention the magnetic field applied to the compound to be tested is varied in a manner to cause the material to be subjected to a field intensity such that the coincidence of NMR and NQR frequencies occurs in the compound. For maximum effect, this field intensity is maintained for a period of time that is long compared to the shortened $T_1$ of the compound. The NMR response in the selected nuclei of the compound is then tested. Following exposure of the compound to a different, second, magnetic intensity for a time period that is short compared to the $T_1$ of the nuclei in that field intensity, the NMR response in the selected nuclei is again tested. The NMR response obtained following the exposure to the first field intensity is compared to the NMR response obtained following the exposure to the said second field intensity. If the compound has coincident NMR and NQR frequencies at either field intensity, then this will be revealed by a difference between the first and second NMR responses made apparent by comparison.

An alternate approach is to hold the magnetic field steady and interrogate the sample with RF pulses at a varied rate. The relaxation time $T_1$ will vary for some compounds, and the variation in time between tests will indicate the presence of a particular compound.

DETAILED DESCRIPTION OF THE DISCLOSED EMBODIMENT

Figure 1:
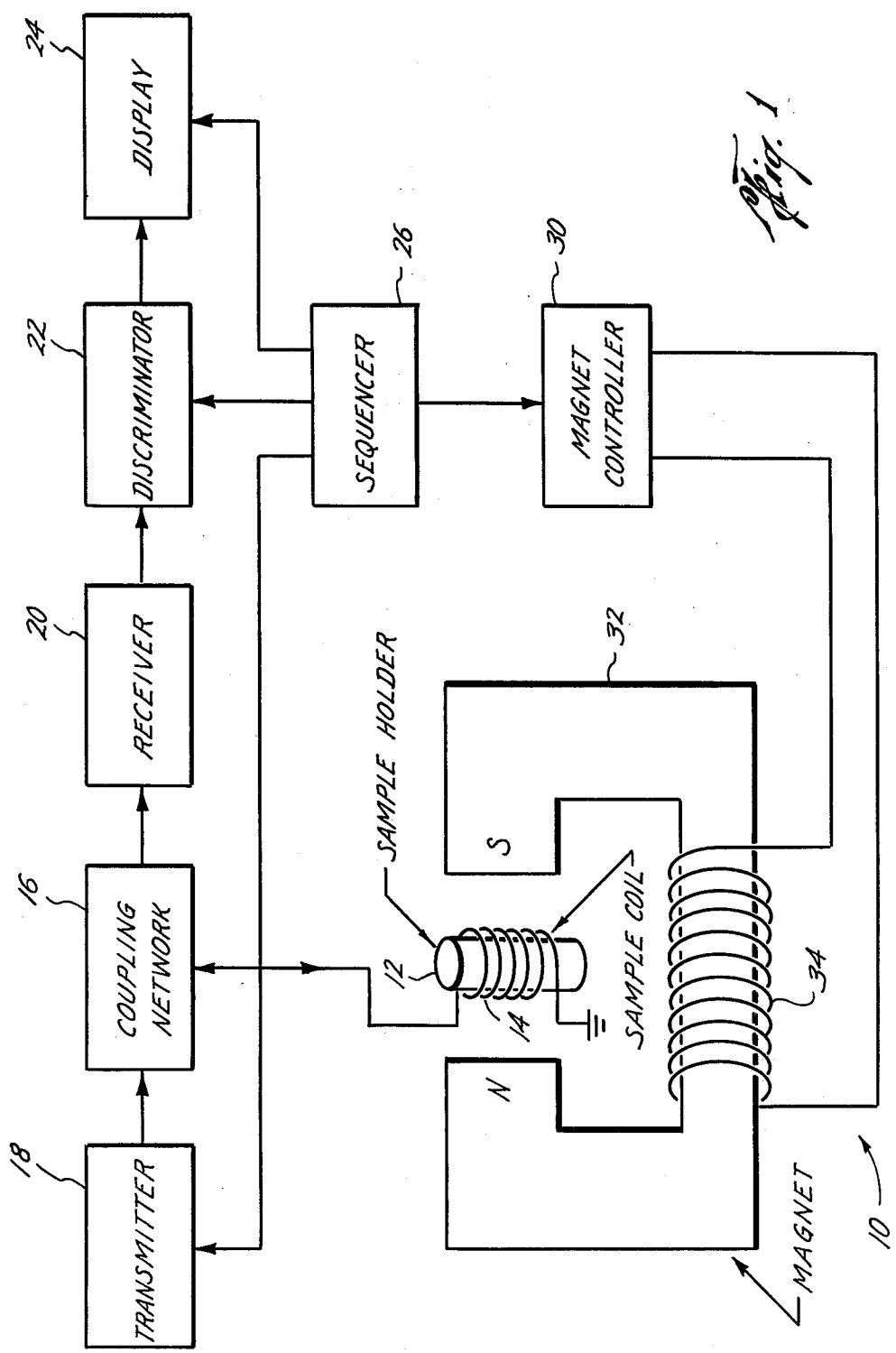
FIG. 1 shows a sample testing apparatus in accordance with the teachings of the present invention.

Attention is first directed to FIG. 1 of the drawings, where the numeral 10 identifies an NMR detection apparatus in accordance with the teachings of the present invention. The testing apparatus incorporates a sample holder 12 which is surrounded by a coil 14. The coil 14 is connected in a circuit communicating with a coupling network 16. The coil and coupling network typically handle RF signals.

A transmitter 18 is connected to the coupling network 16. A receiver 20 for the frequencies of interest is likewise connected to the coupling network. The receiver 20 forms an output signal which is communicated to a discriminator 22 which, in turn, is connected to a display 24. The timed operation of all the equipment is determined by a sequencer 26. It forms a signal which is supplied on a conductor to the transmitter 18, causing it to fire and form an output pulse. This timed event is also communicated to the discriminator 22 and the display 24. The sequencer 26 is also connected to a magnet controller 30. It forms a suitable DC level which forms a magnetic field across the poles of a large magnet 32. The magnet 32 has a coil or winding 34 which is connected to the controller 30. Current through the winding establishes a specified magnetic field between the opposed or facing poles of the magnet.

The operation of the device is best described by reference to certain timing charts and the signals shown on them. As a beginning point, the magnet 32 establishes a fixed magnetic field. It is adjustable to various levels, but it is a DC field. It is typically a low level magnetic field, typically in the range of up to a few thousand gauss. It has been observed that the amplitude of the NMR signal response depends on the duration of magnetization which is inflicted on the specimen. As previously defined, NMR phenomena occurs in a fixed magnetic field, and that is the field provided by the magnet 32.

NMR output additionally requires an RF magnetic field at right angles to the fixed or constant magnetic field. To this end, the coil 14 has an axis approximately perpendicular to the lines of magnetic flux between the two poles of the magnet 32.

The rate at which alignment of the nuclei is achieved in the sample is indicated by the time constant $T_1$. Thus, after the sample is placed in the magnetic field, and the magnetic field is turned on, the amplitude of the prospective NMR response increases as a function of duration. Full amplitude output is attained only after continued exposure to the magnetic field for a period in excess of several fold of $T_1$.

Dependent on the closeness of coupling of the element to the lattice in which it is located, there is a time-variant alignment with the field. Closely bound elements align slowly and require hundreds of seconds to obtain one time constant (63%) alignment. Moreover, each interrogation has a disrupting effect. The RF field initiates precession toward the RF lines of force from randomly achieved azimuthal positions of the element nuclei previously magnetically aligned. Thus, each RF pulse is a disturbance upsetting alignment, and, therefore, excessive pulsing with RF pulse bursts is counterproductive.

Sampling of the NMR response signal is occasioned by transmitter bursts through the use of the transmitter 18 connected to the coil 14. However, each transmitted burst substantially disrupts previously achieved nuclear alignment, and, hence, realignment must thereafter be restarted to prepare for another RF pulse. This extends the time in which a full amplitude NMR response (proportional to alignment) can be reached. Accordingly, excessive sampling is self-defeating in that the time to obtain a high degree of alignment is extended. So to speak, the alignment process must start all over again as a result of the disturbance to alignment caused by the transmitted energy burst applied to the coil 14.

There is a relationship between the magnetic field of the magnet 32 and the frequency of the field formed by the coil 14. This is given by the relationship of equation 1.

$$Freq = k \times H$$

where
Freq = transmitter frequency
k = a constant
H = the static magnetic field strength.

By choosing a value of magnetic field strength, a particular frequency for the NMR excited element is achieved. The magnetic field strength is adjustable to vary the NMR frequency. The adjustment will benefit the test provided the field intensity adjustment is made with a view of finding and matching the frequency of the second sample element in the NQR mode.

Under the assumption that the first element is present with a second element subject to NQR, the two frequencies are matched at a common frequency. The NQR mode of excitation is not universal to all elements. It is limited to those having a nuclei spin number greater than $\frac{1}{2}$, and includes isotopes of chlorine, iodine, nitrogen and others. It is eventually a fixed frequency phenomena. The NQR frequency can be varied slightly by external magnetic fields, but it cannot be widely tuned by external means as can the NMR frequency. It is pre-existant, and the frequency is dependent upon internal electric fields in the molecular structure of the material. Therefore, the magnetic field is varied to vary the NMR frequency. The NQR frequency of the second element, present in close proximity to the first element in the lattice, is fixed, and the NMR frequency is tuned to achieve a match-up. Coupling between the first and second elements is achieved such that energy is exchanged between elements to accelerate alignment of the first element. The frequency match-up need not be perfect, but the rate of alignment is improved as the match-up is improved. The NQR is intrinsic to the material of the lattice and is primarily independent of external stimulation. When the NMR mode of excitation in the first element is achieved, there is an interchange between the two elements, thereby transferring energy between them and modifying the longitudinal relaxation time of the first element. This time will be represented hereinafter as $T_3$. $T_3$ is thus the modified longitudinal relaxation time.

Consider an example of the two element relationship. For a sample of the explosive RDX, the nitrogen 14 has three frequency groupings where NQR occurs, one being in the range of 1.830 to 1.733 megahertz, a second frequency of about 3.359 to 3.410 megahertz, and a third of about 3.192 to 5.240 megahertz. The NMR frequency of hydrogen in the explosive RDX corresponding to these three NQR frequency ranges was achieved at magnetic field intensities of about 400, 800 and 1200 gauss, respectively. This data has been obtained for hydrogen and nitrogen in the presence of one another in the explosive RDX, using the nitrogen isotope having a molecular weight of 14. As will be observed, in the explosive RDX, each frequency is not a single resonant frequency, but it is a collection of several closely grouped frequencies. As an example, the frequencies mentioned above are ranges, there being at least two frequencies or more in each grouping. While higher frequencies may exist at which the NMR of one element matches the NQR of another element, it may be easier to use the lower frequencies listed above, but higher crossover frequencies provide an improved NMR response.

Figure 6:
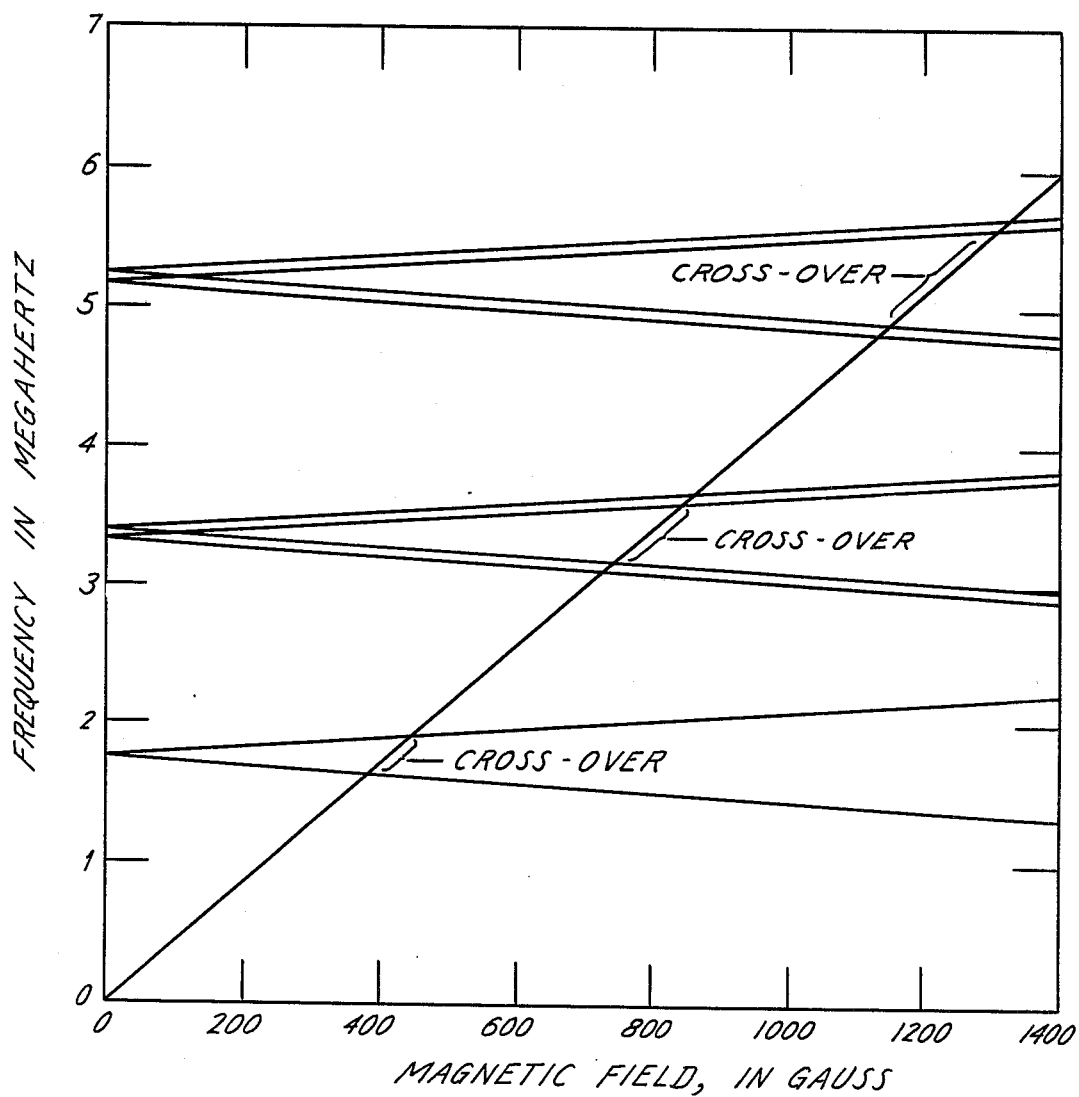
FIG. 6 is a graph of frequency versus field intensity showing several frequencies at which coincidence will occur.

As will be observed from the foregoing data, multiple frequencies exist in the explosive RDX at which the hydrogen-nitrogen energy transfer occurs. The relationship between the NMR frequency of hydrogen in RDX and magnetic field strength is thus shown in FIG. 6, along with the crossover regions where coincidence occurs with the NQR frequencies of nitrogen 14. Spreading of the NQR lines is a result of the Zeeman effect caused by the magnetic field intensity.

Figure 2:
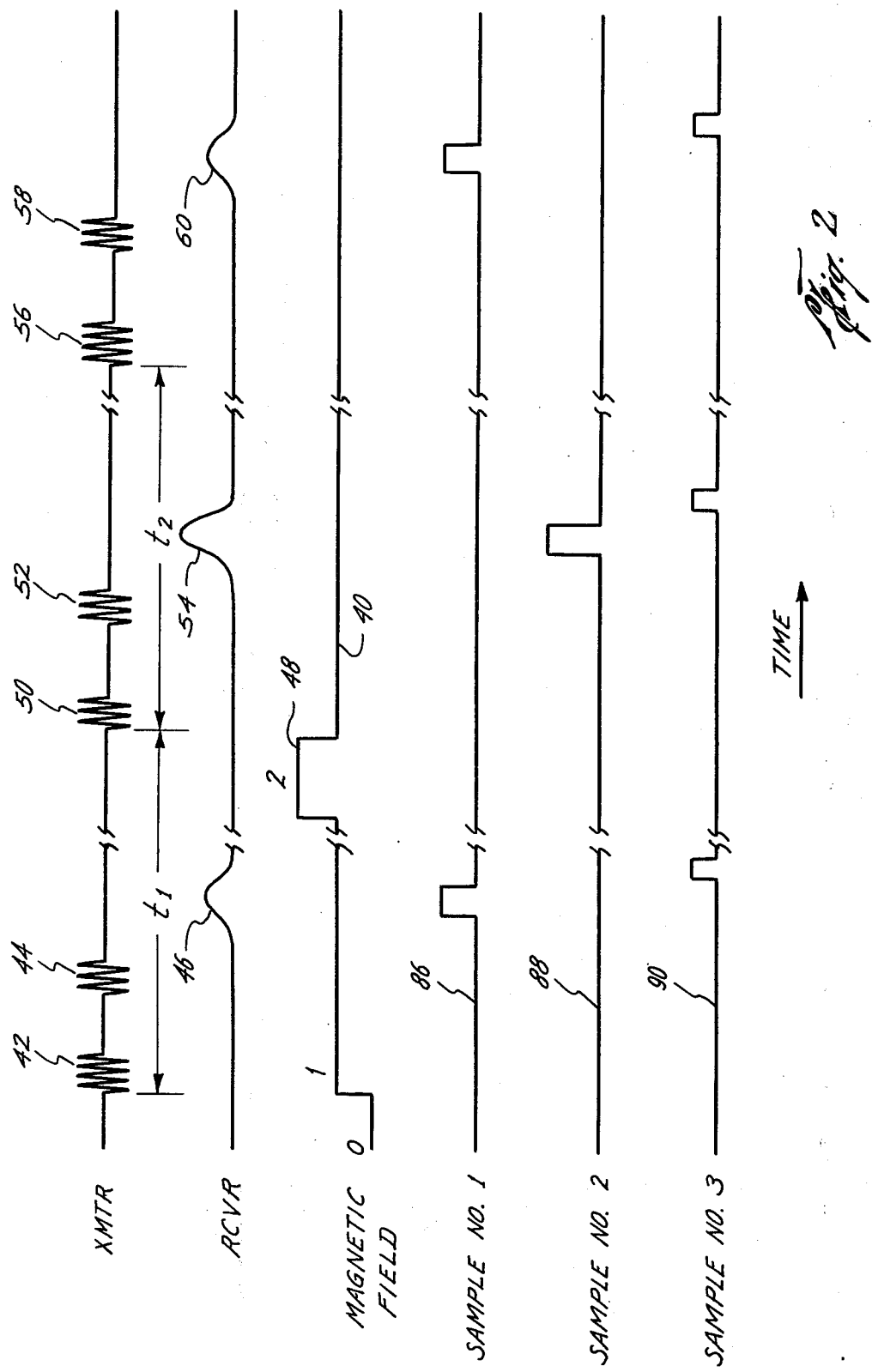
FIG. 2 is a timing chart showing how an enhanced signal can be obtained.

Attention is next directed to FIG. 2 of the drawings. In FIG. 2 of the drawings, several timed events are shown. FIG. 2 is a timing chart. The numeral 40 identifies a first magnetic level applied to the specimen from the magnet 32. Preferably, a constant magnetic field is achieved for the moment. The transmitter 18 is operated to form a first RF burst 42 of a specified length. After a pause, another burst 44 is applied from the transmitter. Typically, the RF burst lengths may be on the order of 10 microseconds and the pause between bursts of similar duration. After the application of the two bursts, the receiver 20 forms an output pulse 46 which occurs after the second pulse. This pulse 46 is indicative of the NMR echo signal from a single element of the material present in the field. To this juncture, the NQR effect of the second element has not come into play.

It is presumed that the pulses 42 and 44 have a fixed and common frequency duration and amplitude. Thereafter, the following excitation is applied to the specimen. The level 48 identifies a different magnetic field intensity level. This different, fixed field acts on the sample which has first and second elements in it which are intimately comingled with one another. This is a magnetic field level which brings the NMR frequency of the first element to a frequency matching the NQR frequency of the second element.

The field intensity is again returned to the level 40 and the NMR echo is obtained by the transmitted interrogation pulses identified by the burst 50 and a second pulse burst identified at 52. The pulses 50 and 52 are the same as the pulses 42 and 44 in frequency, power level spacing and length. The receiver output is an enhanced or enlarged NMR signal 54, if material of characteristics described in the immediately preceding paragraph is present in the sample under test. It is enhanced by the coupling between the first and the second element at a field level 48 which reduces $T_1$ to $T_3$, and thus allows greater nuclear alignment or polarization of the first element to occur within the time period separating the burst pair 42 and 44 from the pair 50 and 52 than occurred during the time period between the first application of the field 40 and the first burst pair 42 and 44. The larger amplitude is indicative of the enhanced NMR echo amplitude.

The timing chart of FIG. 2 thus shows an enhanced received signal. The enhancement is the result of the greater polarization achieved in the first element within the available time as a result of shortened relaxation time which results from the match-up of the NMR-NQR frequencies. The NQR frequency of the second element and the NMR frequency of the first element are matched, and energy then easily transfers between the two elements. It should be noted that the NMR frequency is variable dependent on field intensity. By and large, the NQR frequency is only slightly variable by external stimuli and is fixed by the molecular structure of the element.

The detectable NMR amplitude is quite small at the beginning of the magnetic field because there is very little initial alignment among the nuclei within the field. The rate at which alignment occurs relates to the definition of the spin-lattice relaxation time $T_1$. Because the initial amplitude is small, an NMR signal at this time may be difficult to detect.

In FIG. 2, the magnetic field is dropped back to the level 40. Again, two more transmitter bursts are applied to the coil 14. These are the pulse bursts 56 and 58 in FIG. 2. The receiver will again provide an output pulse 60. It is shown to have reduced amplitude. This is the result of the small nuclear realignment achieved in the short time interval compared to the relaxation time, elapsed since the last disturbance, the pulse pair 50 and 52. It should be noted that during the time period between pair 50 and 52 and pair 56 and 58 the magnetic field intensity is such that coincidence of the NMR-NQR frequencies does not occur, and the relaxation time is not reduced.

It should be noted that the time ($t_1$) between the pulse pair 42 and 44 and pulse pair 50 and 52 may be the same as the time period, $t_2$, between pulse pair 50 and 52 and pulse pair 56 and 58. During the time period, $t_1$, the nuclei attain greater alignment or polarization because the time constant $T_1$ is reduced to $T_3$. This reduction is achieved by the enhanced coupling that occurs between the nuclei of the first element and the nuclei of the second element when the magnetic field intensity is such that the NMR frequency of the first element coincides with the NQR frequency of the second element as previously described. $T_3$ may be much shorter than $T_1$, and nuclear alignment will then occur at a much faster rate with the shorter time constant than is the case with the longer time constant. By choosing the times of $t_1$ and $t_2$ to be short compared to $T_1$ but long compared to $T_3$, the nuclear alignment that occurs during the interval $t_1$ will be much greater than that which occurs during the time $t_2$. This causes the NMR echo 54 to be larger than the NMR echo 60 when the material contains a compound wherein field intensity 48 causes a reduction of $T_1$ as previously described. The two NMR signals 54 and 60 obtained from materials which do not contain a compound with these characteristics will be of very nearly equal amplitudes. A comparison of the amplitudes of these two signals yields information on the presence of the compound of interest in the material under test.

Figure 3:
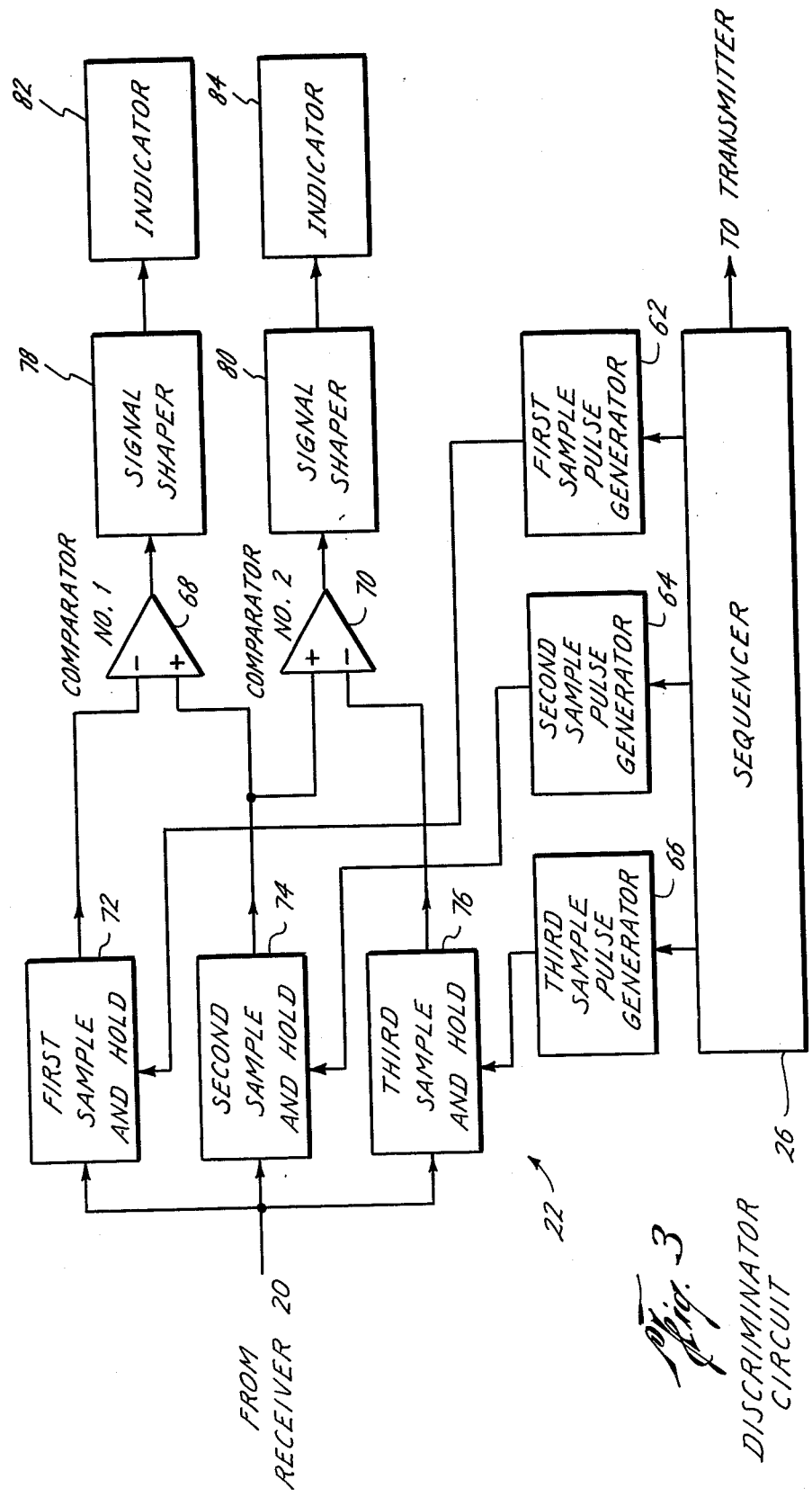
FIG. 3 is a detailed schematic block diagram circuit illustrating a means for analyzing data.

Attention is next directed to FIG. 3 of the drawings where the discriminator is shown in greater detail. It is triggered by the sequencer 26. It has an input signal from the receiver 20 which is connected to three similar, even identical, sample and hold amplifiers. Each amplifier is turned on by a pulse generator. The pulse generator 62, the generator 64 and generator 66 are respectively connected to amplifiers 72, 74 and 76. The first and second amplifiers are connected to a first comparator 68. A second comparator 70 is connected to the second and third amplifiers. They measure the difference in the signals from the sample and hold amplifiers and provide outputs to first and second signal shapers 78 and 80. They, in turn, drive indicators 82 and 84. Returning now to FIG. 2 of the drawings, the sequencer 26 triggers the sample pulse generators to take samples in the timed sequence indicated by the timed wave forms 86, 88 and 90 of FIG. 2. These signals are the input signals for the comparators. From the timed operation of the sample and hold amplifiers, the signals are delivered for use in comparing with known criteria to identify the presence of a particular compound in the test specimen.

Figure 4:
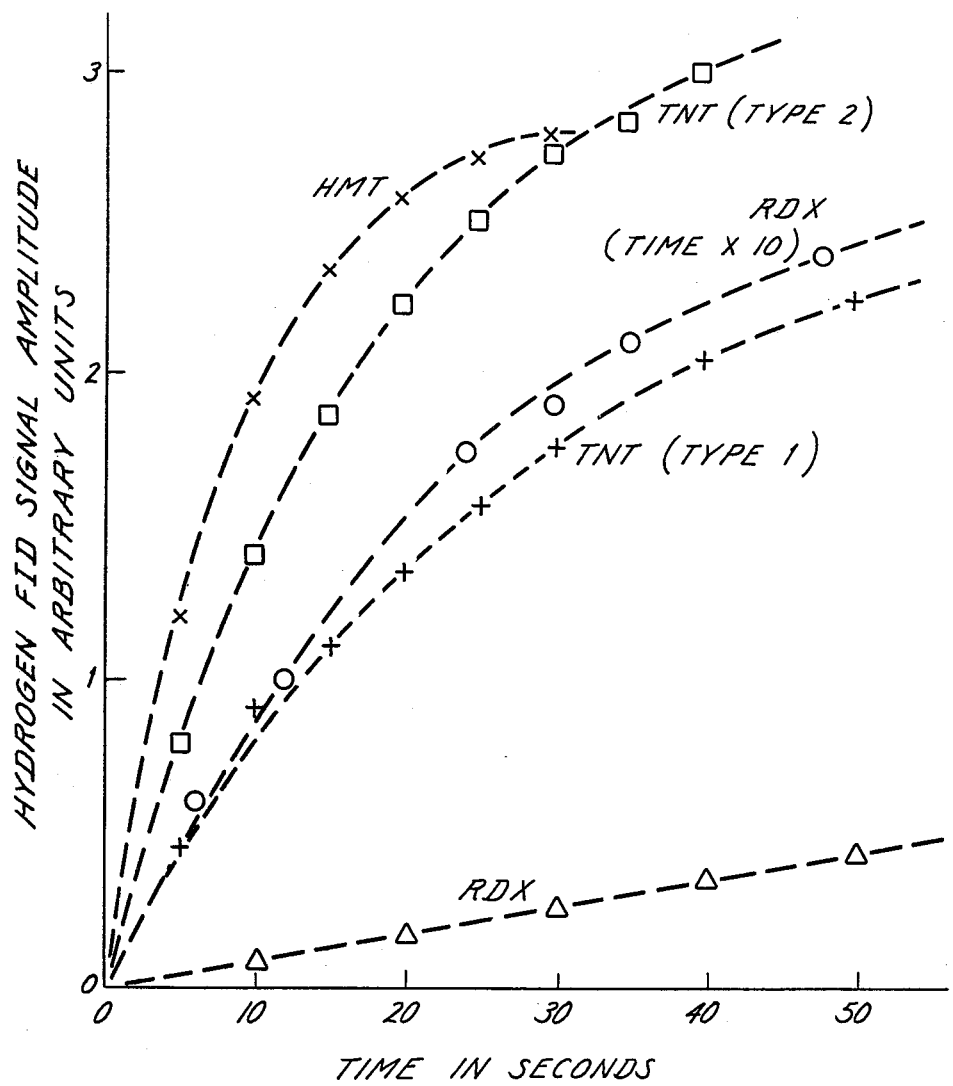
FIG. 4 is a graph of signal output versus time for various chemicals illustrating various relaxation times.

For various and sundry explosives, it will be appreciated that the signal provided is dependent on the chemical and crystalline makeup of the explosives. The relaxation time of several explosives is rather long. This is illustrated in FIG. 4 of the drawings. FIG. 4 thus illustrates how the response will differ. The ordinate of the plot is the peak amplitude of the hydrogen free induction decay nuclear magnetic response which follows a single burst of appropriate RF energy from the transmitter. A similar plot would be applicable to the NMR echo following a double pulse burst as previously described. FIG. 4 thus shows the manner in which the hydrogen NMR response increases as a function of time. Time is the time after first exposure of the sample to the magnetic field or the elapsed time following the prior disorienting transmitter burst. For the explosive material RDX, it is also plotted on a tenfold scale in FIG. 4. As will be appreciated, its response is so slow that time will not ordinarily permit the use of the NMR detection techniques without the enhanced response taught by the present invention. In other words, the enhancement taught herein is almost essential to detect RDX in any reasonably short period of time.

Figure 5:
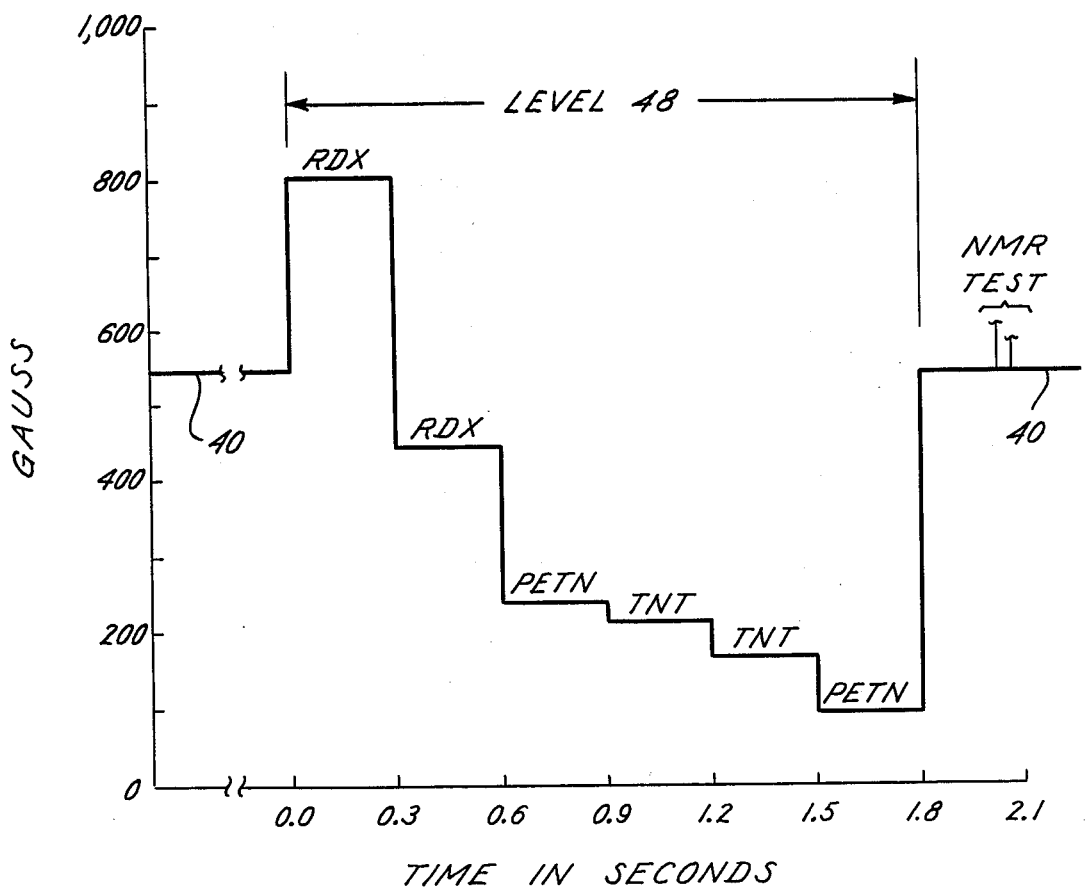
FIG. 5 is a graph of magnetic field strength versus time showing how a time-variant magnetic field tests for various explosive materials.

FIG. 5 shows a timed and shaped pulse for the magnetic field (level 48 in FIG. 2) which assures NMR frequency level crossings between the relatively fixed NQR responses of various explosives which are comprised of at least hydrogen and nitrogen in compounds. As shown in FIG. 5, the magnetic field is measured in gauss, and it is stepped or varied to the indicated levels. As it is varied, it passes through various intensities indicated on the decay curve where the hydrogen NMR frequency is equal to the nitrogen NQR frequency for the indicated explosive compounds. The curve thus shows how the NMR frequency of the hydrogen nuclei is made equal to the NQR frequencies of the coupled nitrogen nuclei in the compound and where within a short interval the nuclei become aligned to enable detection.

Returning now to FIG. 2 of the drawings for explanation of another means of discrimination where the relaxation time of the element of interest is not altered, attention is directed to the response of the receiver shown on the chart. Assume that the sample includes an element in it which is to be detected. The element has a specified relaxation time which is relatively long compared to that of interfering materials which may be present. The time between the first doublet 42 and 44 and the second doublet 50 and 52 is made long in comparison to the relaxation time. The time between the second doublet burst and the third doublet burst is shorter than the first time and preferably shorter than the $T_1$ of the material to be tested. The amplitude of the NMR response following the second doublet burst is maximum while the amplitude following the third doublet burst may be relatively small. The two differing received responses provide a basis for discrimination.

The apparatus shown in FIG. 3 is used for obtaining this measure. The frequency selected for the doublet burst from the transmitter is selected such that the nuclei to be detected is resonant when the magnetic field is at the level 40 shown in FIG. 2. The different magnetic field intensity 48 is not required for this discrimination technique.

The described apparatus and method of the present invention finds application primarily in the detection of explosives, but it can be used to detect the presence of elements in other types of compounds. It functions quite nicely with inorganic materials. Organic materials present no difficulty either. An example of a detectable nonexplosive material exemplifying another hydrogen-nitrogen coupling is hexamethylenetetramine.

The present invention provides output data which can be compared with the signature of selected chemical compounds. While there might be some ambiguity, in the sense of detecting explosives, the ambiguity presents no problem. Thus, the explosive RDX may have a signature similar to a nonexplosive compound. When used in inspection for bombs and the like, it is wise to treat the nonexplosive compound as an explosive. This occurs out of an abundance of precaution, and, to that extent, the ambiguity might be inconvenient but certainly not dangerous. More importantly, this ambiguity is highly unlikely in inspecting packages, letters and other mail. Therefore, the existence of possible ambiguities in the data is not meaningful. What is meaningful is that RDX has a characteristic signature in parameters of the NMR-NQR cross coupling between the hydrogen and nitrogen in the explosive. Needless to say, other elements of the materials can also be excited and tested. It is not necessary to test only for hydrogen and nitrogen. The tests can be run for hydrogen and nitrogen, subsequently rerun for hydrogen-chlorine interaction and so on. In each instance, a different signature can be developed and compared with standards obtained from laboratory measurements.

Representative test data for the hydrogen NMR frequency equal to the nitrogen 14 NQR frequency for several materials is as follows:

| Chemical | Field in Gauss | Frequency in Megahertz |
| --- | --- | --- |
| RDX explosive | 1220 | 5.2 |
| RDX explosive | 790 | 3.4 |
| RDX explosive | 420 | 1.8 |
| PETN | 210 | 0.9 |
| PETN | 120 | 0.5 |
| PETN | 104 | 0.4 |
| TNT | 204 | 0.87 |
| HMT | 185 | 0.79 |

The explosives listed above can be scanned by the time shaped magnetic pulse of FIG. 5 which is representative of the range of variations or intensity levels. The variations of field intensity interrogates for the listed explosives. HMT (or hexamethylenetetramine) is not an explosive, and it is included to show the response of a nonexplosive. Indeed, the signature of a two element (one isotope NQR responsive element) compound or mixture can be analyzed. The signature is quickly obtained, and it is readily compared to the expected data. In these tests, the NMR of hydrogen at 587 gauss is a frequency of about 2.5 megahertz. The frequency is not critical for scanning for other coupled NQR elements, and, hence, the frequency can be any value, say 2.0 to 5.0 megahertz. For best discrimination, it should not be selected to coincide with the NQR frequency of a material to be detected. Where a reduction of the relaxation time only is desired, it may be selected to coincide with the NQR frequency.

The foregoing is directed to the preferred embodiment, but the scope thereof is determined by the claims which follow.

We claim:

1. Apparatus for detecting in a sample the presence of a first element in the presence of a second element which apparatus comprises:
   (a) magnet means to produce a magnetic field acting on the comingled first and second elements which magnetic field has a specified intensity;
   (b) RF coil means acting at right angles to the magnetic field acting on the sample;
   (c) transmitter means connected to said RF coil means to produce a transmitted pulse burst of specified frequency, amplitude and duration acting on the sample;
   (d) receiver means connected to said RF coil means which forms an output voltage proportional to the nuclear magnetic resonance response of the nuclei of the first element; and
   (e) means for controlling the magnetic field intensity of said magnet means to achieve a level selected such that the resonant frequency of the first element in the nuclear magnetic resonance mode is approximately equal to the second element nuclear quadrupole resonance so that the NMR signal at said receiver means is enhanced.

2. The apparatus of claim 1 wherein said magnetic field control means causes the field intensity to change between two or more selected levels and to remain at each level for a selected period of time.

3. The apparatus of claim 2 wherein said receiver means is connected to an amplitude comparator means.

4. The apparatus of claim 3 wherein said comparator means is connected to an indicator means.

5. The apparatus of claim 4 wherein said indicator means is responsive to the difference between the amplitude of the nuclear magnetic resonance signal from the first element at a first magnetic field intensity and the amplitude of the nuclear magnetic resonance signal from the first element at a second magnetic field intensity.

6. The apparatus of claim 4 wherein said indicator means is responsive to the difference between the amplitude of the nuclear magnetic resonance response following a first transmitted pulse burst and the amplitude of the nuclear magnetic resonance response following a second transmitted pulse burst.

7. The apparatus of claim 4 wherein the magnetic field intensity controlled by said magnetic field control means during the first transmitter pulse burst is at a first intensity level, the magnetic field intensity is then changed to a second intensity level and remains at said level for a selected period of time, and then the magnetic field intensity is returned to the first intensity level and the second transmitted pulse burst is then generated by said transmitter means.

8. The apparatus of claim 7 wherein the first magnetic field intensity is such as to cause the nuclear magnetic resonance frequency of a first element in a sample to be approximately equal to the frequency of said transmitter means and within the frequency range of said receiver means and the second magnetic field intensity causes the nuclear magnetic resonance frequency of a first element to be approximately equal to the nuclear quadrupole resonance frequency of a second element comingled with the first element in the sample.

9. The apparatus of claim 7 wherein the first magnetic field intensity is such as to cause the nuclear magnetic resonance frequency of the first element in the sample to be approximately equal to the frequency of said transmitter means and within the frequency range of said receiver means and approximately equal to the frequency of the nuclear guadrupole resonance of the second element comingled with the first element in the sample and wherein the second magnetic field intensity level is such as to cause the nuclear magnetic resonance frequency of the first element to be different from the nuclear quadrupole resonance frequency of the second element.

10. The apparatus of claim 7 wherein the said second magnetic field level is varied by said magnetic field control means over a range of specified intensities.

11. The apparatus of claim 10 wherein the said second magnetic field level is varied over a range of intensities and remains at selected intensity levels for selected periods of time.

12. The apparatus of claim 10 wherein the range of field intensity variation causes the range of the nuclear magnetic resonance frequency of the first element to correspond to the nuclear quadrupole resonance frequency of the second element in the sample.

13. The apparatus of claim 11 wherein the selected field intensities are such as to cause the nuclear magnetic resonance frequency of the first element to be approximately equal to the nuclear quadrupole resonance frequency of one or more other elements in the sample.

14. The apparatus of claim 1 wherein the said transmitter means is adapted to produce two or more pulse bursts of specified frequency, amplitude and duration acting on the sample.

15. The apparatus of claim 14 wherein said transmitter means forms pulse bursts as doublets.

16. The apparatus of claim 14 wherein the first transmitted pulse burst is followed by a second transmitted pulse burst and wherein the period of time separating the first pulse burst from the second pulse burst is selected to cause the amplitudes of the nuclear magnetic resonance response following each burst to differ.

17. The apparatus of claim 14 wherein the time period between a first burst and a second burst is different from the time period between the second burst and a third burst to vary the amplitude of the nuclear magnetic resonance response following the third burst compared to that following the second burst.

18. The apparatus of claim 17 wherein the pulse bursts are repeated in a sequence such that the time periods between consecutive bursts is alternated between selected values.

19. The apparatus of claim 16 wherein the magnetic field is constant at the intensity required to make the nuclear magnetic resonance frequency of the first element to be approximately equal to the frequency of said transmitter means and within the frequency range of said receiver means to cause the differences in the amplitude of the nuclear magnetic resonance responses of the first element following each transmitter burst to be enhanced when the relaxation time of the first element nuclei is within specified ranges.

20. The apparatus of claim 19 wherein the magnetic field intensity is changed between bursts.

21. The apparatus of claim 6 wherein said indicator means is responsive to the amplitudes of the nuclear magnetic resonance responses at selected times separated by a selected time interval following the transmitter pulse burst.

22. The apparatus of claim 6 wherein the comparator means incorporates sample and hold amplifiers.

23. The apparatus of claim 1 wherein said transmitter means operates to form first and second transmitted pulse bursts of specified frequency, amplitude and duration and said receiver means operates to detect the envelope of the output signal from said RF coil means.

24. The apparatus of claim 1 wherein said magnet means forms a field having a controlled intensity from about zero to a selected maximum.

25. The apparatus of claim 1 wherein said receiver means is connected to first, second and third sample and hold amplifier means; and further including first, second and third timing generators for switching on said sample and hold amplifiers in a timed sequence; and further including comparator means connected to said amplifier means for receiving the outputs thereof in timed sequence controlled by said timing generator means to form output signals resulting from said comparisons indicative of the nuclear magnetic resonance signals received from the first element experienced at differing magnetic intensities from said magnet means.

26. The apparatus of claim 1 wherein the first element is hydrogen and the second element is nitrogen, and the two elements are in an explosive material placed in said magnetic field and wherein said receiver means is connected to an indicator means forming an output indication indicative of the signatures of known explosives where each signature is obtained by adjustment of said magnet means to one or more specified magnetic intensities.

27. The apparatus of claim 1 including a means responsive to the output of said receiver means for indicating a reduction in relaxation time of the first element.

28. The apparatus of claim 6 wherein said magnetic means is operated at a first magnetic level for a specified time, and said modifying means changes the magnetic field intensity between first and second levels during a specified interval.

29. The apparatus of claim 7 wherein the variations in the magnetic field intensity vary the nuclear magnetic resonance frequency of the first element proportionally to magnetic field intensity variations, and the signal from said receiver means is enhanced by shortening the time interval required by the first element to achieve nuclear polarization.

30. A method of detecting a first element in the presence of a second element in a sample of interest comprising the steps of
(a) placing the sample suspected of having the elements therein in a magnetic field of suitable intensity;
(b) varying the magnetic field intensity to level selected such that the magnetic field interacts with the first element in a nuclear magnetic resonant mode which resonant interaction has a frequency approximating the nuclear quadrupole resonant frequency of the second element and the frequencies are sufficiently close to permit the interchange of energy between the two elements so that the transferred energy shortens the nuclear magnetic resonant response time of the first element;
(c) interrogating the sample by means of at least one transmitted RF pulse burst at approximately right angles to the magnetic field which pulse burst has a selected frequency, duration and magnitude; and
(d) detecting after interrogation the nuclear magnetic resonance signal of the first element as a measure of its presence and concentration.

31. The method of claim 30 including the step of exposing the sample to a first magnetic field intensity level for a specified interval and thereafter altering the magnetic field intensity to another level to vary the first element to an alternate nuclear magnetic resonance frequency approximating the nuclear quadrupole resonance frequency.

32. The method of claim 31 wherein the step of interrogating the sample utilizes two pulse bursts separated by a specific time.

33. The method of claim 30 wherein the transmitted pulse burst has a frequency which is independent of the nuclear quadrupole resonance frequency.

34. The method of claim 30 wherein the second element is selected from those isotopes having a spin number greater than $\frac{1}{2}$.

35. The method of claim 34 wherein the first element is hydrogen.

36. The method of claim 35 including the step of varying the magnetic field to about 1220 gauss in testing for RDX explosive.

37. The method of claim 35 including the step of varying the magnetic field to about 790 gauss in testing for RDX explosive.

38. The method of claim 35 including the step of varying the magnetic field to about 420 gauss in testing for RDX explosive.

39. The method of claim 35 including the step of varying the magnetic field to about 210 gauss in testing for PETN explosive.

40. The method of claim 35 including the step of varying the magnetic field to about 120 gauss in testing for PETN explosive.

41. The method of claim 35 including the step of varying the magnetic field to about 104 gauss in testing for PETN explosive.

42. The method of claim 35 including the step of varying the magnetic field to about 204 gauss in testing for TNT explosive.

43. The method of claim 30 wherein the magnetic field is set on a first level and thereafter varied to a second rate over a specified interval to sweep past at least two suspected nuclear quadrupole resonance frequencies which frequencies differ for differing explosive samples.

44. The method of claim 30 wherein the magnetic field is established for an interval and thereafter varied toward zero gauss to vary the nuclear magnetic resonance of the first element to match the nuclear quadrupole resonance of the second element.

45. A method of detecting the presence of an element in a sample comprising the steps of:
(a) placing the sample in a magnetic field of specified intensity;
(b) transmitting an interrogation signal into the sample using an RF coil at right angles to the magnetic field which signal is a pair of pulses separated in time by a specified interval sufficiently short that sample recovery is not complete and which pulses have a specified frequency and duration;

(c) detecting a nuclear magnetic resonance response from the sample by an RF coil coupled to the sample and at right angles to the magnetic field; and (d) periodically repeating the transmitted pair of pulses at two or more different time intervals which are selected to be within a specific range to obtain an enhanced detected signal.

46. The method of claim 1 including the step of comparing the amplitude of the NMR signal following the second pair of pulses with the amplitude of the NMR signal following the first pair of pulses.

47. The method of claim 30 for detecting the presence of an element in a sample characterized such that the relaxation time of the resonating nuclei of the sample is within a specified range relative to the spacings between the pairs of pulses.

48. The method of claim 30 for detecting explosive materials by testing the nuclear magnetic resonance response of hydrogen nuclei.

49. The method of claim 30 for detecting the presence of dynamite explosives.

50. The method of claim 48 for detecting TNT explosive.

51. The method of claim 48 for detecting PETN explosive.

52. The method of claim 45 wherein the spacing $t_1$ between first and second pairs of pulses is relatively long compared to the relaxation time $T_1$ of the element and the spacing $t_2$ between the second and third pairs of pulses is less than the spacing $t_1$ between the first and second pairs of pulses.

* * * * *

UNITED STATES PATENT AND TRADEMARK OFFICE
CERTIFICATE OF CORRECTION

PATENT NO. : 4,166,972

DATED : Sep 4, 1979

INVENTOR(S) : James D. King et al.

It is certified that error appears in the above-identified patent and that said Letters Patent is hereby corrected as shown below:

Column 15, line 10, "claim 1" should read -- claim 52 --.

Signed and Sealed this

Seventh Day of September 1982

[SEAL]

Attest:

GERALD J. MOSSINGHOFF

Attesting Officer     Commissioner of Patents and Trademarks